| United States Patent [19] | [11] | 4,330,612 |
|---|---|---|
| Tashiro et al. | [45] | May 18, 1982 |

[54] LAMINATE OF MONOLAYER FILM OF CYCLIZED BUTADIENE POLYMER AND OTHER PHOTOSENSITIVE LAYER

[75] Inventors: Mituru Tashiro, Yokohama; Yoshiyuki Harita, Kawasaki; Kunihiro Harada, Machida, all of Japan

[73] Assignee: Japan Synthetic Rubber Co., Ltd., Tokyo, Japan

[21] Appl. No.: 169,464

[22] Filed: Jul. 16, 1980

Related U.S. Application Data

[63] Continuation-in-part of Ser. No. 109,220, Jan. 3, 1980, abandoned.

[30] Foreign Application Priority Data

Jan. 23, 1979 [JP] Japan ................................ 54-5614
Aug. 31, 1979 [JP] Japan .............................. 54-111597

[51] Int. Cl.$^3$ ............................................. G03C 1/68
[52] U.S. Cl. .................................... 430/286; 430/287; 430/288; 204/159.22; 428/215; 428/521
[58] Field of Search ..................... 430/286, 287, 288; 204/159.22; 428/215, 521

[56] References Cited

U.S. PATENT DOCUMENTS

| 3,837,859 | 9/1974 | Tsuji et al. | 430/286 |
| 3,865,597 | 2/1975 | Broyde | 430/286 |
| 3,894,163 | 7/1975 | Broyde | 430/286 |
| 3,948,667 | 4/1976 | Ichikawa et al. | 430/286 |
| 4,023,973 | 5/1977 | Imaizumi et al. | 430/286 |

*Primary Examiner*—Jack P. Brammer
*Attorney, Agent, or Firm*—Oblon, Fisher, Spivak, McClelland & Maier

[57] ABSTRACT

A photosensitive resin film consisting of a monolayer film of a composition comprising (a) a cyclized product of butadiene polymer, (b) at least one member selected from the group consisting of a photo-crosslinking agent, a photo-sensitizer and a photo-polymerization initiator, and (c) a storage stabilizer, and if necessary, a dye and/or a pigment, or a laminate structure photosensitive resin film prepared by laminating to the above photosensitive resin film a composition comprising (d) 100 parts by weight of a polymer or copolymer of monoolefinically unsaturated compound, (e) 5 to 100 parts by weight of a polyfunctional, photo-polymerizable, unsaturated compound having at least two photopolymerizable double bonds in the molecule, (f) at least one member selected from the group consisting of a photo-crosslinking agent, a photo-sensitizer and a photo-polymerization initiator, and (g) a storage stabilizer, and if necessary, a dye and/or a pigment. Said photosensitive resin film can be intimately contacted with a negative film, and therefore, a sharp image can be obtained by exposing the resulting laminate to light through the negative film and then developing it. Said photo-sensitive resin film can also be laminated to a solid surface without entrapping any air even if the solid surface has irregularities. When the film has been exposed to light and developed, there is obtained a film excellent in heat resistance.

14 Claims, No Drawings

4,330,612

LAMINATE OF MONOLAYER FILM OF CYCLIZED BUTADIENE POLYMER AND OTHER PHOTOSENSITIVE LAYER

CROSS-REFERENCES TO RELATED APPLICATIONS

This application is a continuation-in-part of Application Ser. No. 109,220 filed on Jan. 3, 1980 now abandoned.

BACKGROUND OF THE INVENTION

1. Field of the Invention

This invention relates a photosensitive resin film excellent in workability and usable as a film resist, as well as to a process for producing a laminate by use thereof.

2. Description of the Prior Art

Film resists are mainly used as etching resist or plating resist for forming a conductor pattern in the production of printed circuit boards. As such a film resist, "Riston" (a trade name of Du Pont Co.), "Laminar" (a trade name of Dynachem Corp.), and "Hitachi Photosensitive Resist Film" (a trade name of Hitachi Kasei Kogyo K.K.) are commercially available. They are all composed of an acrylate polymer, an acrylate monomer, a storage stabilizer, a dye and a photo-polymerization initiator. These compositions are soft and sticky because of containing an acrylate monomer, so that they are handled in the form that they are put between a support film, such as a polyester film, and a protecting film, such as a polyolefin film. Nevertheless, these compositions have faults that, even if handled in the abovementioned form, the compositions protrude from both sides of the support film after a long-term storage at high temperatures to injure the openability of film, that the acrylate monomer has a characteristic unpleasant odor, that a photomask cannot be brought into intimate contact with the photosensitive layer when printing the image because of the stickiness of the layer, and hence the printing has to be done through intervention of the support film so that a sharp image is difficult to obtain, that the photo-crosslinked film is brittle and the image produced by photo-crosslinking is apt to be disfigured, that the film lacks adhesion to the solid surface on which an image is to be formed, and that entrapment of air tends to occur at the time of lamination.

Apart from etching resist and plating resist, there is included a solder resist for printed circuit board in the field using a resist in the form of a film. Hitherto, in permanently protecting or soldering circuits in the printed circuit board industry, a solder resist has been used for the purpose of hiding the parts of circuit requiring no soldering with a resist coating film, thereby preventing the solder bridge between circuits. In this case, heat resistance is needed so that a commercially available etching or plating resist cannot be, as it is, used as a solder resist. Commercially available films for solder resist are also photosensitive compositions of acrylate type, which have the same faults as the above-mentioned dry film resists for etching resist and plating resist have and, at the same time, are insufficient in heat resistance.

The present inventors have conducted extensive research with the aim of overcoming these faults of commercially available film resists to discover a novel photosensitive resin film by which all the above-mentioned faults can be overcome and which can be used as any of the etching resist, plating resist and solder resist. If a printed circuit board is manufactured from it, the steps are simplified and a sharp image can be obtained, so that the photosensitive resin film of this invention contributes much to the industry.

SUMMARY OF THE INVENTION

It is an object of this invention to provide a novel photosensitive resin film comprising a cyclized product of butadiene polymer as its main component.

It is another object of this invention to provide a process for producing a laminate by use of said film.

Other objects and advantages of this invention will become apparent from the following description.

According to this invention, there is provided (1) a photosensitive resin film consisting of a monolayer film of a composition comprising (a) a cyclized product of butadiene polymer, (b) at least one member selected from the group consisting of a photo-crosslinking agent, a photo-sensitizer and a photo-polymerization initiator and (c) a storage stabilizer, and (2) a laminate structure photosensitive resin film prepared by laminating to the above photosensitive resin film (1) a composition comprising (d) 100 parts by weight of a polymer or copolymer of monoolefinically unsaturated compound (referred to hereinafter as olefinic polymer), (e) 5 to 100 parts by weight of a polyfunctional, photo-polymerizable, unsaturated compound having at least 2 photo-polymerizable double bonds in the molecule (referred to hereinafter as photo-polymerizable unsaturated compound), (f) at least one member selected from the group consisting of a photo-crosslinking agent, a photo-sensitizer and a photo-polymerization initiator, and (g) a storage stabilizer.

This invention further provides a process for producing a laminate which comprises applying the said photosensitive resin film to a heated surface of a solid material, laminating the film to the solid material, placing a negative film on the photosensitive film of the resulting laminate in intimate contact between the two, exposing the photosensitive film to light through said negative film and developing the same with a developing agent.

DETAILED DESCRIPTION OF THE INVENTION

Although the cyclized product of butadiene polymer used in this invention is not limited in respect of the mode of linkage of butadiene units, it is preferable that the molecular weight of starting butadiene polymer, the degree of cyclization and the intrinsic viscosity $[\eta]$ of the cyclized product are in the specified ranges.

The starting butadiene polymer includes homopolymers and copolymers of butadiene, the examples of which include cis-1,4-polybutadiene, trans-1,4-polybutadiene and copolymers of butadiene and copolymerizable vinyl compounds such as styrene, α-methylstyrene, ethylene and propylene. Preferably, the starting butadiene polymer is homopolymer of butadiene.

The molecular weight of starting butadiene polymer is preferably in the range of 30,000–300,000. If the molecular weight is smaller than 30,000, the image obtained by photo-crosslinking becomes brittle when the photosensitive resin is used as a photosensitive resin film. If the molecular weight exceeds 300,000, a high temperature is required for laminating the photosensitive resin film on a base board so that the thermal gelation of photosensitive resin film cannot be prevented perfectly.

The degree of cyclization is preferably in the range of 40–70%. If the degree of cyclization is less than 40%, the cyclized product of butadiene polymer exhibits a rubber-like character so that its composition protrudes from both sides of the supporting film during storage. If the degree of cyclization exceeds 70%, the film of cyclized product of butadiene polymer becomes poor in flexibility so that its lamination to a copper-clad laminate does not proceed well.

The intrinsic viscosity $[\eta]_{toluene}^{30°\,C.}$ of the cyclized product is preferably in the range of 0.3–0.7 dl/g. If it is less than 0.3 dl/g, the photosensitive resin film and the photo-crosslinked part become brittle. If it exceeds 0.7 dl/g, the thickness of photosensitive resin film becomes less even.

If, among the cyclized products of butadiene polymer falling in the above-mentioned ranges, those satisfying equations (I)–(III) mentioned below in respect of the degree of cyclization (hereinafter referred to as DC) of the cyclized product of butadiene polymer and the molecular weight (hereinafter referred to as MW) of starting butadiene polymer are used, the photosensitive resin film obtained therefrom is free from stickiness, so that it can be exposed to light in intimate contact with a photomask:

(I) $30,000 \leq MW \leq 300,000$
(II) $DC/10 \geq 9.5 - \log MW$
(III) $DC/5 \leq 8.5 + \log MW$ Said cyclized product of butadiene polymer can be produced by the process mentioned in, for example, Japanese Patent Publication No. 29,879/73, Japanese Patent Publication No. 1,318/78 and Japanese Patent Kokai (Laid-Open) No. 66,684/73.

As the photo-crosslinking agents, photosensitizers and photo-polymerization initiators which may appropriately be added to the cyclized product of butadiene polymer, there may be mentioned photo-crosslinking agents, azide compounds, such as 2,6-bis(4'-azidobenzal)cyclohexanone, bis(4-azidobenzal)-acetone, 4,4'-diazidostilbene, p-azidobenzalacetophenone and the like. As said photo-sensitizers, there may be mentioned carbonyl compounds, such as p,p'-tetramethyl-diaminobenzophenone, benzophenone, anthraquinone, 1,2-benzanthraquinone and violanthrone, and nitro compounds, such as 5-nitroacenaphthene, α-nitronaphthalene, 2-nitrofluorene and the like. As said photo-polymerization initiators, there may be mentioned benzoin compounds, such as benzoin, benzoin methyl ether, benzoin isopropyl ether, benzoin dimethyl ketal and the like, acetophenone compounds, such as α,α-dimethoxy-α-phenylacetophone, α,α-diethoxyacetophenone, and the like, and sulfur compounds, such as diphenyl disulfide and the like. These compounds exhibit the maximum effect when used either alone or in admixture of two or more in a proportion of 0.1–10 parts by weight per 100 parts by weight of the cyclized product of butadiene polymer.

Examples of the storage stabilizer used in this invention include alkylphenol compounds, such as 2,2'-methylenebis(4-methyl-6-t-butylphenol), 2,2'-methylenebis(4-ethyl-6-t-butylphenol) and 2,6-di-t-butyl-p-cresol; aromatic amine compounds, such as phenyl-β-naphthylamine, diphenyl-p-phenylenediamine, phenylisopropylphenylenediamine; sulfur compounds, such as dilauryl thiodipropionate, 4,4'-thiobis(6-t-butyl-m-cresol) and 2-(3,5-di-t-butyl-4-hydroxyanilino)-4,6-bis(n-octylthio)-1,3,5-triazine; and the like. They are used either alone or in admixture of two or more, preferably in a proportion of 0.1–5 parts by weight per 100 parts by weight of the cyclized product of butadiene polymer.

The olefinic polymer used in this invention can easily be prepared by a conventional polymerization reaction. The molecular weight of the olefinic polymer is not critical, although the normally liquid polymer is not desirable because it is difficult to form into a photosensitive resin film and when it has an extremely high molecular weight, it is difficult to dissolve and when it is formed into a photosensitive resin film, a high resolving power is difficult to obtain. The molecular weight of the polymer is preferably 30,000 to 1,000,000, more preferably 50,000 to 800,000.

The olefinic polymer used in this invention includes, for example, polymers and copolymers of aromatic hydrocarbons, such as styrene, α-methylstyrene, and the like; halogenated hydrocarbon monomers such as vinyl chloride, vinylidene chloride, and the like; vinyl ester monomers such as vinyl acetate, vinyl propionate, and the like; vinyl ether monomers such as vinyl methyl ether and the like; nitrogen-containing monomers such as acrylonitrile, acrylamide, N-vinylcarbazole, N-vinylpyrrolidone and the like; acrylic acid; methacrylic acid; acrylates; methacrylates; and olefins such as ethylene, propylene and the like. Among them, homopolymers of acrylic acid, methacrylic acid, an acrylate, a methacrylate and copolymers obtained by polymerizing 50% by weight of these monomers with other monomers are preferable. Particularly preferable are polymethyl methacrylate, and a copolymer of 50% by weight of methyl methacrylate and other monomers.

The photo-polymerizable unsaturated compound used in combination with the olefinic polymer includes, for example, diesters of acrylic and methacrylic acids, such as ethylene glycol diacrylate, ethylene glycol dimethacrylate and the like; triesters of acrylic and methacrylic acids, such as trimethylolpropane triacrylate, trimethylolpropane trimethacrylate, and the like; and tetraesters of acrylic and methacrylic acids, such as pentaerythritol tetraacrylate, and the like. Although there may also be used acrylates and methacrylates of the alkyleneoxide adducts of Bisphenol A, for example, 2,2-bis(4-acryloxyethoxyphenyl)-propane, 2,2-bis(4-methacryloxyethoxyphenyl)propane and the like; compounds obtained by reacting acrylic or methacrylic acid with a compound having at least two epoxy groups such as a cycloaliphatic epoxy resin, a Bisphenol A-epichlorohydrin type epoxy resin, or the like, the use of them results in a reduction of the adhesiveness of a photosensitive resin film. Therefore, the photo-polymerizable unsaturated compound should preferably have at least three photo-polymerizable double bonds in the molecule. In particular, there are preferred triesters of acrylic and methacrylic acids, such as trimethylolpropane triacrylate, trimethylolpropane trimethylacrylate; and tetraesters of acrylic and methacrylic acids, such as tetramethylolmethane tetraacrylate, tetramethylolmethane tetramethacrylate and the like.

These photo-polymerizable unsaturated compounds are used in an amount of 5 to 100 parts by weight, preferably 20 to 80 parts by weight, per 100 parts by weight of the olefinic polymer.

The photo-crosslinking agent, photo-sensitizer and photo-polymerization initiator used in combination with the olefinic polymer includes the same photo-crosslinking agents, photo-sensitizers and photo-polymerization initiators as added to the above-mentioned cyclized product of butadiene polymer. That is to say, the above-mentioned azide compounds, carbonyl compounds, nitro compounds, benzoin compounds, and sulfur compounds may be used. These are preferably used in an amount of 0.1 to 10 parts by weight per 100 parts by weight of the olefinic polymer.

The storage stabilizer used in combination with the olefinic polymer and the photo-polymerizable unsaturated compound includes those which are added to the cyclized product of polybutadiene as a storage stabilizer, and the amount of the storage stabilizer added is preferably 0.1 to 5 parts by weight per 100 parts by weight of the olefinic polymer.

In testing the photosensitive resin film of this invention, the image formed thereon is examined with the naked eye when it is intended to be applied to some usages. Therefore, it is preferable that the resist film itself is colored for the purpose of facilitating the visual examination. Therefore, it is preferable to color the photosensitive resin film comprising (a) a cyclized product of butadiene polymer, (b) at least one member selected from the group consisting of a photo-crosslinking agent, a photosensitizer, and a photo-polymerization initiator, and (c) a storage stabilizer, and/or a photosensitive resin film comprising (d) the olefinic polymer, (e) a photo-polymerizable unsaturated compound, (f) at least one member selected from the group consisting of a photo-crosslinking agent, a photo-sensitizer and a photo-polymerization initiator, and (g) a storage stabilizer. The coloration can be carried out by use of a dye and/or a pigment. Although any dye and/or pigment may be used essentially, the image of photo-crosslinked part remaining after development is required to be colored. Accordingly, it is preferred that said dye and/or pigment is difficult to extract with halogenated hydrocarbons, such as 1,1,1-trichloroethane, which is a conventionally employed liquid developer. Among such dyes and/or pigments, those insoluble in the halogenated hydrocarbons are preferably used. Examples of said dye or pigment include azo compounds, such as C. I. Pigment Orange 14 (C. I. 21165) and C. I. Pigment Red 13 (C. I. 12395); phthalocyanine compounds, such as C. I. Pigment Blue 15 (C. I. 74160) and C. I. Pigment Green 7 (C. I. 74260); anthraquinone compounds, such as C. I. Pigment Blue 22 (C. I. 69810) and C. I. Vat Orange 3 (C. I. 59300); perinone compounds, such as C. I. Vat Orange 7 (C. I. 71105) and C. I. Vat Red 15 (C. I. 71100); indigoid compounds, such as C. I. Vat Violet 3 (C. I. 73395); carbonium compounds, such as C. I. Pigment Red 81 (C. I. 45160); quinacridone compounds, such as C. I. Violet 19 (C. I. 46500); and the like. These dyes and pigments are added to the cyclized product of butadiene polymer or the olefinic polymer in a proportion of 0.01–3.0 parts by weight per 100 parts by weight of the cyclized product of butadiene polymer or the olefinic polymer. If the amount of said dye and/or pigment added exceeds 3.0 parts by weight, the absorption of light by the dye or pigment becomes great, so that the photo-crosslinking becomes insufficient. If it is less than 0.01 part by weight, the coloring effect is insufficient.

In producing the monolayer photosensitive resin film of this invention, (a) a cyclized product of butadiene polymer, (b) at least one member selected from the group consisting of a photo-crosslinking agent, a photosensitizer and a photo-polymerization initiator, (c) a storage stabilizer and, if necessary, a dye and/or a pigment are made into a uniform composition by using a solvent, such as toluene, xylene, tetrachloroethylene and the like, and then the composition is coated onto a polytetrafluoroethylene or a support prepared by applying a mold release treatment to a polyethylene film, polyethylene terephthalate film, other plastic film, paper or the like, after which the resulting assembly is dried and the coating film is peeled off from the support to obtain a monolayer film having a thickness of preferably 5–300 μm, more preferably 10–200 μm, most preferably 10–150 μm.

The laminate structure photosensitive resin film of this invention is prepared by the following way: For example, on the monolayer photosensitive resin film obtained above is coated a homogeneous composition obtained by dissolving in a solvent such as toluene, methyl ethyl ketone, ethyl acetate, trichloroethylene or the like, (d) the olefinic polymer, (e) the photo-polymerizable unsaturated compound, (f) at least one member selected from the group consisting of a photo-crosslinking agent, a photo-sensitizer, and a photo-polymerization initiator, and (g) a storage stabilizer, and if necessary, a dye and/or a pigment, and the coated composition is then dried to obtain the laminate structure photosensitive resin film. Alternatively, in the same manner as mentioned above, a photosensitive resin film is first prepared from (d) the olefinic polymer, (e) the photo-polymerizable unsaturated compound, (f) at least one member selected from the group consisting of a photo-crosslinking agnet, a photo-sensitizer and a photo-polymerization initiator, and (g) a storage stabilizer, and if necessary, a dye and/or a pigment, and the resulting photosensitive resin film is then coated with a composition comprising (a) the cyclized product of butadiene polymer, (b) at least one member selected from the group consisting of a photo-crosslinking agent, a photosensitizer, and a photo-polymerization initiator, (c) a storage stabilizer, and if necessary, a dye and/or a pigment to form a photosensitive resin film. The film thickness of the laminate structure photosensitive resin film is preferably 10 to 300 μm.

The thickness of the photosensitive resin film of this invention varies depending upon the characteristic property which is required as a permanent protecting film or a photosensitive resin film. The thickness also varies depending upon the shape of concave-convex surface of the solid on which an image to be protected is formed. For example, in the case of a printed circuit board, the thickness varies depending upon the thickness of circuit and the density of circuit. When the film is used as a solder resist, its preferable thickness is usually in the range of 10 to 150 μm.

The amount of the solvent remaining in the photosensitive resin film of this invention is preferably kept in a range not exceeding 1% by weight.

The present photosensitive resin film per se comprising (a) the cyclized product of butadiene polymer, (b) at least one member selected from the group consisting of a photo-crosslinking agent, a photo-polymerization initiator and (c) a storage stabilizer has a sufficient resolving power. However, when 1,1,1-trichloroethane which is free from inflammability and is used as a developing liquid for the above-mentioned acrylate film photoresist which is now commercially available is used as a developing liquid for the photosensitive resin film of the cyclized product of butadiene polymer mentioned above, the resolving power is limited. This problem can be solved by laminating thereto a photosensitive resin composition comprising (d) the olefinic polymer, (e) a photo-polymerizable unsaturated compound, (f) at least one member selected from the group consisting of a photo-crosslinking agent, a photo-sensitizer and a photo-polymerization initiator and (g) a storage stabilizer.

In this invention, when the photosensitive resin film is laminated to a solid surface, the temperature of the solid surface is usually 50° to 180° C., preferably 80° to 160° C., which is a temperature at which the film does not deteriorate and can be softened.

When the laminate structure photosensitive resin film is used, the lamination is effected so that the photosensitive resin composition comprising (a) the cyclized product of butadiene polymer, (b) at least one member selected from the group consisting of a photo-crosslinking agent, a photo-sensitizer and a photo-polymerization initiator and (c) a storage stabilizer is contacted with the material to which the composition is to be laminated.

Since the photosensitive resin film of this invention has a sufficient strength in itself, it is not necessary to have a three layer structure comprising a support film layer, a photosensitive resin film layer and a protecting film layer as in the conventional photosensitive resin films. The process of this invention is particularly suitable for laminating a photosensitive resin film onto an irregular surface of solid, such as a solid surface on which a relief has been formed, a roughened copper on which no relief is formed, a metallic board having an irregular surface, and the like. Particularly when the concave-convex difference is 0.03 mm or more, it is understandable that the process of this invention is excellent as compared with a conventional process using a photosensitive resin film of a three-layer structure because the amount of air entrapped is markedly smaller in the process of this invention. Even in the process of this invention, the entrapment of air sometimes takes place when the concave-convex difference exceeds 0.2 mm.

As the method of heating the solid surface, any method may be employed. For example, there may be used a method which comprises placing a solid in a thermostat kept at 50°–180° C., taking out the solid after its surface has reached the predetermined temperature and then laminating it immediately.

The lamination is usually conducted by pressing the photosensitive resin film onto the heated solid surface by means of a rubber roller.

The photosensitive resin film of this invention is characterized in that, it has no stickiness at room temperature. It can be handled even without a supporting film and a protective film and it can be exposed to light in intimate contact with a negative film, so that the problem of low resolution of the conventional film resists can be solved, and a pattern closely following the negative film can be printed. Moreover, the monolayer film consisting of an composition comprising (a) cyclized product of butadiene polymer, (b) at least one member selected from the group consisting of a photo-crosslinking agent, a photo-sensitizer and a photo-polymerization initiator and (c) a storage stabilizer is free from the volatile monomer.

The photosensitive resin film of this invention has a sufficient heat resistance and there is no such limitation that soldering at 260° C. is conducted only one time (about 10 sec) as in the case of conventional acrylate type solder resist, and the photosensitive resin film of this invention can withstand soldering at 360° C. for 5 min.

Further, the photosensitive resin film of this invention can be laminated satisfactorily to solids having as great as a concave-convex difference as 150 $\mu$m, such as printed circuit board, by means of the conventional laminator without using vacuum laminator and without being accompanied by imperfect contact with solid board due to entrapment of air.

The developing liquid for the photosensitive resin film of this invention is not critical, and there may be used, for example, halogenated hydrocarbons, such as 1,1,1-trichloroethane, 1,1,1-trichloroethylene and the like; aromatic hydrocarbons such as toluene, xylene and the like.

The photosensitive resin film of this invention can be used in a plating resist, an etching resist, and a solder resist, and can greatly contribute to industrial fields requiring fine processing including electronics filed.

DESCRIPTION OF THE PREFERRED EMBODIMENTS

By the following Examples, this invention is illustrated more specifically. This invention is not limited by these Examples and any modification thereof may be made in the scope of the essence of this invention.

EXAMPLE 1 cis-1,4-Polybutadiene (molecular weight 67,000, cis-1,4-content 96%) was cyclized in toluene to obtain a cyclized product having a degree of cyclization of 56% and an intrinsic viscosity $[\eta]_{toluene}^{30°\ C.}$ of 0.54 dl/g. To 100 g of the toluene solution containing 27.8% by weight of the cyclized product were added 0.278 g of Cyanine Blue (C. I. 74160), 1.39 g of benzoin isopropyl ether and 0.278 g of 4,4'-thiobis(6-t-butyl-m-cresol). A uniform composition was prepared therefrom by means of a ball mill.

This composition was coated on a polyester film (coated with a mold release composed mainly of HO[-Si(CH$_3$)$_2$O]$_n$H), and dried at 80° C. for one hour to obtain a film having a thickness of 17 $\mu$m. Then, the composition film was stripped off from the support film and pressed onto a copper-clad laminate previously heated to 120° C. by means of rubber rollers at a feed rate of 1 m/min to obtain a laminate. A test pattern photomask having a minimum width of 100 $\mu$m was intimately contacted with the laminated film thus obtained. It was exposed to light for 20 seconds by means of an ultra-high pressure mercury lamp having a light intensity of 270 W/m$^2$ and then developed with a developing solution for micro-photoresist consisting of a petroleum distillate having a boiling point range of 158° to 177° C. free from aromatics, whereby a clearly colored image was obtained.

Then, etching was carried out at 60° C. for 10 min by the immersion method by use of 25% by weight aqueous solution of ferric chloride. Then, the photosensitive resin film was removed by rubbing it with a cloth wetted with methylene chloride, whereby a copper foil pattern closely following the mask was obtained.

The degree of cyclization was determined by the following equation, and this applies to all the Examples and Comparative Examples:

$$\text{Degree of cyclization} = \left(1 - \frac{\substack{\text{Proportion of hydrogen atoms}\\\text{bonded to carbons having}\\\text{unsaturation after cyclization}\\\text{to the total hydrogen atoms}}}{\substack{\text{Proportion of hydrogen atoms}\\\text{bonded to carbons having}\\\text{unsaturation before cyclization}\\\text{to the total hydrogen atoms}}}\right) \times 100$$

EXAMPLE 2

The procedure of Example 1 was repeated, except that the compounds shown below were substituted for the benzoin isopropyl ether and the time of exposure was altered. The results obtained were the same as in Example 1.

|   |   | Amount (g) | Time of exposure (second) |
|---|---|---|---|
| A. | p,p'-Tetramethyldiamino-benzophenone | 1.39 | 20 |
| B. | { p,p'-Tetramethyldiamino-benzophenone | 0.14 | 20 |
|   | Benzophenone | 0.21 |   |
| C. | 2,6-Bis(4'-azidobenzal)-cyclohexanone | 0.70 | 1 |

EXAMPLE 3

The procedure of Example 1 was repeated, except that the compounds shown below were substituted for the 4,4'-thiobis(6-t-butyl-m-cresol). The results were quite the same as in Example 1.

| A. | 2-(3,5-Di-t-butyl-4-hydroxyanilino)-4,6-bis(n-octylthio)-1,3,5-triazine | 0.278 g |
|---|---|---|
| B. | 2,2'-Methylenebis(4-ethyl-6-t-butylphenol) | 0.278 g |

EXAMPLE 4

A composition was prepared by repeating the procedure of Example 1, except that the substances mentioned below were used in place of the Cyanine Blue. It was formed into a film, which was then laminated to a copper-clad laminate, exposed to light and developed to obtain a colored image. Subsequent procedures were carried out in the same manner as in Example 1. The results obtained were the same as in Example 1.

|   | Compounds substituted for the Cyanine Blue | Heat resistance and softness |
|---|---|---|
| A. | C.I. Violet 19 | The same as in Example 1. |
| B. | C.I. Vat Orange 3 | " |
| C. | C.I. Pigment Green 7 | " |

EXAMPLE 5 cis-1,4-Polybutadiene (molecular weight 45,000, cis-1,4-content 88%, trans-1,4 content 5%) was cyclized in toluene to obtain a cyclized product having a degree of cyclization of 51% and an intrinsic viscosity $[\eta]_{toluene}^{30°\,C.}$ of 0.43 dl/g. To 100 g of a toluene solution containing 30.0% by weight of the cyclized product were added 0.15 g of p,p'-tetramethyldiaminobenzophenone, 0.375 g of benzophenone, 0.30 g of 4,4'-thiobis(6-t-butyl-m-cresol), 0.30 g of 2,2'-methylenebis(4-methyl-6-t-butylphenol) and 0.15 g of C. I. Pigment Green 7 (C. I. 74260), from which a uniform composition was prepared by means of a ball mill. This composition was coated on a mold release treated paper, the mold release being composed mainly of HO[Si(CH$_3$)$_2$O]$_n$H, and dried at 80° C. for one hour to obtain a film having a thickness of 22 μm. Then, the composition film was stripped off from the mold release treated paper and laminated to a copper-clad laminate previously heated to 110° C. at a rate of 90 cm/min. The laminated film was exposed to light for 60 sec through a test pattern photomask by means of an ultra-high pressure mercury lamp having a light intensity of 270 W/m$^2$, after which it was developed at room temperature for 2 min with 1,1,1-trichloroethane by immersion method to obtain a colored image. The colored image was post-cured at 160° C. for 30 minutes. Subsequently, the dipping of the laminate in a solder bath at 260° C. for 10 sec was repeated 10 times. No change was observed.

EXAMPLE 6 cis-1,4-Polybutadiene (molecular weight 67,000, cis-1,4 content 96%) was cyclized in toluene to obtain a cyclized product having a degree of cyclization of 56% and an intrinsic viscosity $[\eta]_{toluene}^{30°\,C.}$ of 0.54 dl/g. To 100 g of a toluene solution containing 27.8% by weight of the cyclized product were added 0.278 g of Cyanine Blue (C. I. 74160), 1.39 g of benzoin isoporpyl ether and 0.278 g of 4,4'-thiobis(6-t-butyl-m-cresol), and a uniform composition was prepared therefrom by means of a ball mill.

This composition was coated on the same polyester film as in Example 1, and dried at 80° C. for one hour to obtain a film having a thickness of 17 μm. The composition film was stripped off from the support film and pressed onto a copper-clad laminate preheated to 120° C. by means of rubber rollers at a feed rate of 1 m/min, whereby a laminate was obtained. A test pattern photomask having a minimum width of 100 μm was intimately contacted with the laminated film and exposed to light for 20 sec by means of an ultra-high pressure mercury lamp having a light intensity of 270 W/m$^2$, after which it was developed with the same developing solution for microphotoresist as in Example 1. Thus, a clearly colored image was obtained.

Then, solder plating was carried out to a thickness of about 7 μm in the usual manner by use of a boronfluoric acid plating bath. The photosensitive resin film was removed by rubbing it with a cloth wetted with methylene chloride, after which etching was carried out in an ammonium persulfate bath. As a result, there was obtained a sharp image made of solder-plated copper foil.

EXAMPLE 7 cis-1,4-Polybutadiene having a molecular weight of 63,400 and a cis-1,4 content of 98% was cyclized in toluene medium with a catalyst consisting of trichloroacetic acid and diethylaluminum sesquichloride to obtain a cyclized product having a degree of cyclization of 56% and an intrinsic viscosity $[\eta]_{toluene}^{30°\,C.}$ of 0.51 dl/g. To 100 g of a toluene solution containing 30.0% by weight of the cyclized product were added 0.3 g of Cyanine Green (C. I. 74160), 0.15 g of p,p'-tetramethyldiaminobenzophenone and 0.3 g of 4,4'-thiobis(6-t-butyl-m-cresol), and a uniform composition was prepared therefrom by means of a ball mill. This composition was coated on the same polyester film as in Example 1 and dried at 80° C. for 30 min to obtain a film having a thickness of 23 μm.

Then, the film was stripped off from the support film and laminated by means of conventional rubber rollers to a lattice-formed circuit board, the copper part of which had a line width of 150 μm, a distance between any two lines of 100 μm and a thickness of 70 μm, wherein the surface temperature of the laminated solid was 120° C. and the rate of lamination was 2 m/min.

The film was so laminated as to perfectly reproduce the concave-convex surface without any entrapment of air.

A test pattern photomask having a minimum width of 100 μm was intimately contacted therewith, the film was exposed to light for 20 seconds by means of an ultra-high pressure mercury lamp having a light intensity of 270 W/m² and then it was developed with 1,1,1-trichloroethane, whereby a clearly colored image was obtained. Then it was heat-treated at 150° C. for 60 min and there was obtained a permanent protecting film of image closely following the negative mask and excellent in dimensional accuracy. No change was observed even when the dipping in a solder bath at 360° C. for 20 sec was repeated 15 times, so that it was satisfactorily usable as a solder resist.

Comparative Example 1

The film resist "Riston 730 FR" of Du Pont, for which the use of a special laminator is appointed, was laminated with a usual laminator to a lattice-formed circuit board under the same conditions as in Example 7.

The film resist entrapped air and the intimate contact between the film resist and the circuit board was insufficient. After the same exposure to light, development and heat-treatment as in Example 7 were conducted, a mere immersion in a solder bath at 260° C. for 10 sec resulted in an injury on the surface of the resin, demonstrating its poor resistance to heat and its unsatisfactoriness as a solder resist.

EXAMPLE 8

After the photosensitive resin film of 23 μm in thickness obtained in Example 7 was stripped from the support film, it was laminated to a lattice-formed circuit board having a copper part of 150 μm in line width, 100 μm in distance between any two lines and 150 μm in thickness under the same conditions as in Example 7. The film was laminated perfectly following the concave-convex surface without entrapment of air, and intimate contact with the solid surface was obtained.

EXAMPLE 9

After the photosensitive resin film of 23 μm in thickness obtained in Example 7 was stripped from the support film, it was laminated to the same lattice-formed circuit board as in Example 7 wherein the surface temperature of the laminated solid was 80° C. and the rate of lamination was 2 m/min. The film was laminated perfectly following the concave-convex surface without entrapment of air, and intimate contact with solid surface was obtained.

EXAMPLE 10

A composition was prepared by repeating the procedure of Example 7, except that the substance mentioned below was used in place of the cis-1,4-polybutadiene. It was formed into a photosensitive resin film, laminated to a copper-clad laminate, exposed to light and developed to obtain a colored image. Subsequent procedures were carried out in the same manner as in Example 7. The results obtained were the same as in Example 7. And also, the film was laminated perfectly following the concave-convex surface without entrapment of air, and intimate contact with the solid surface was obtained.

| Starting styrene-butadiene copolymer | |
|---|---|
| Molecular weight: | 78,200 |
| Bonded styrene unit: | 25% |
| Microstructure of butadiene unit: | |
| cis-1,4 | 51% |
| trans-1,4 | 36% |
| vinyl | 13% |
| Cyclized product | |
| Degree of cyclization: | 54% |
| $[\eta]_{toluene}^{30°\ C.}$ : | 0.55 dl/g |

EXAMPLE 11

In toluene, cis-1,4-polybutadiene having a molecular weight of 52,000 was cyclized with a catalyst consisting of trichloroacetic acid and diethylaluminum sesquichloride to obtain a cyclized product having a degree of cyclization of 53% and an intrinsic viscosity $[\eta]_{toluene}^{30°\ C.}$ of 0.47 dl/g.

To 100 g of a 30.0% by weight solution of the cyclized product in toluene were added 0.3 g of cyanin green (C. I. 74160), 0.6 g of 2-methylanthraquinone and 0.3 g of 4,4'-thiobis(6-t-butyl-m-cresole), and the resulting mixture was milled on a ball mill to obtain a uniform composition. This composition was coated on the same polyester film as in Example 1 and the dried at 80° C. for 30 min to obtain a photosensitive resin film (A) having a thickness of 19 μm.

Subsequently, polymethyl methacrylate having a molecular weight of 110,000 was dissolved in toluene to obtain a 30.0% by weight solution, and to 100 g of this solution were added 9 g of trimethylolethane triacrylate, 0.78 g of 2-methylanthraquinone, and 0.39 g of 2,2-methylenebis(4-methyl-6-t-butylphenol) and the resulting mixture was made uniform and then coated on the above film (A), after which the coating was dried at 80° C. for 30 min to obtain a laminate structure photosensitive resin film having a total thickness of 30 μm.

The laminate structure photosensitive resin film thus obtained was stripped off from the supporting film and thereafter laminated to a copper-clad laminate preheated at 110° C. so that the film (A) contacted the copper-clad laminate by pressing them by means of rubber rollers at a feed rate of 1.2 m/min. A test pattern photomask having a minimum line width of 50 μm was intimately contacted with the film laminated and then exposed to light from an ultra-high pressure mercury lamp at an intensity of 270 W/m² for 30 sec, after which the exposed film was developed with 1,1,1-trichloroethane, to obtain a sharp, colored image of 50 μm in line width free from blur of pattern.

Subsequently, the developed laminate was subjected to etching at 50° C. for 10 min in a 25% by weight aqueous ferric chloride solution by an immersion method, after which the etched product was rubbed with a cloth to remove the photosensitive resin film, upon which a copper foil pattern corresponding exactly to the mask pattern was obtained.

EXAMPLES 12 TO 13

In the same manner as in Example 11, a pattern was prepared, except that the following compounds and solvents were substituted for the polymethyl methacrylate and toluene. The results obtained were the same as in Example 11.

| Example No. | The olefinic polymer | Solvent |
|---|---|---|
| 12 | Poly(methyl methacrylate/ethyl methacrylate/acrylic acid = 50/40/10% by weight) | Ethyl acetate |
| 13 | Poly(methyl methacrylate/styrene = 70/30% by weight) | Toluene |

EXAMPLES 14 TO 16

The same procedure as in Example 11 was repeated, except that the following compounds were substituted for the trimethylolethanetriacrylate, to prepare patterns. The results were the same as in Example 11.

| Example No. | Photo-polymerizable unsaturated compound | Amount used |
|---|---|---|
| 14 | Trimethylolpropanetrimethacrylate | 12 g |
| 15 | Tetramethylolmethanetetraacrylate | 12 g |
| 16 | Tetramethylolmethanetriacrylate | 12 g |

EXAMPLE 17

The laminate structure photosensitive resin film obtained in Example 11 was stripped off from the supporting film, and then laminated to a lattice-formed circuit board having a copper part of 100 μm in line width, 100 μm in line distance and 70 μm in thickness, the surface of said board having been heated at 120° C., at a lamination rate of 1.5 m/min by means of conventional rubber rollers.

The laminate structure film was completely laminated on the concave-convex surface and entrapment of air was not observed.

A test pattern photomask having a minimum line width of 50 μm was intimately contacted with the laminate and then exposed for 40 sec to light from a ultra-high pressure mercury lamp having an intensity of 270 W/m², after which the exposed laminate was developed with 1,1,1-trichloroethane, to obtain a sharp, colored image of 50 μm in line width which was free from blur of pattern.

The developed laminate was subsequently subjected to heat treatment at 150° C. for 30 min to obtain an image-permanent protective film corresponding exactly to the negative mask and excellent in dimension precision. When this was immersed in a solder bath at 260° C. 30 times each for 20 sec, no change was observed. Therefore, the product is heat-resistant enough to be used as solder resist.

We claim:

1. A photosensitive resin film consisting of a laminate of a monolayer film of a composition consisting essentially of (a) 100 parts by weight of a cyclized product of butadiene polymer, (b) 0.1–10 parts by weight of at least one member selected from the group consisting of a photo-crosslinking agent, a photosensitizer and a photo-polymerization initiator and (c) 0.1–5 parts by weight of a storage stabilizer, the cyclized product having a degree of cyclization of 40% to 70%, and an intrinsic viscosity $[\eta]^{30°\,C.}$ toluene of 0.3–0.7 dl/g wherein said cyclized product satisfies the equations (I) $30,000 \leq MW \leq 300,000$, (II) $DC/10 \geq 9.5\text{-log MW}$, (III) $DC/5 \leq 85 + \log MW$, and bonded thereto a composition comprising (d) 100 parts by weight of a polymer of a monoolefinically unsaturated compound, (e) 5 to 100 parts by weight of a polyfunctional, photo-polymerizable, unsaturated compound having at least two photo-polymerizable double bonds, (f) at least one member selected from the group consisting of a photo-crosslinking agent, a photosensitizer and a photo-polymerization initiator, and (g) a storage stabilizer.

2. A photosensitive resin film according to claim 1, wherein the laminate structure film has a thickness of 10 to 300 μm.

3. A photosensitive resin film according to claim 1 wherein the laminate structure film has a thickness of 10 to 150 μm.

4. A photosensitive resin film according to claim 1, 2 or 3, wherein said butadiene polymer is a homopolymer of butadiene.

5. A photosensitive resin film according to claim 1, 2 or 3, wherein said butadiene polymer is cis-1,4-polybutadiene or trans-1,4-polybutadiene.

6. A photosensitive resin film according to claim 1, wherein the polymer or copolymer of a monoolefinically unsaturated compound (d) has a molecular weight of 30,000 to 1,000,000.

7. A photosensitive resin film according to claim 1, wherein the polymer or copolymer of a monoolefinically unsaturated compound (d) is a polymer or copolymer prepared by polymerizing or copolymerizing at least one monomer selected from the group consisting of styrene, α-methylstyrene, vinyl chloride, vinylidene chloride, vinyl acetate, vinyl propionate, vinyl methyl ether, acrylic acid, methacrylic acid, an acrylic ester, a methacrylic ester, acrylonitrile, acrylamide, N-vinylcarbasole, N-vinylpyrrolidone, ethylene, and propylene.

8. A photosensitive resin film according to claim 1, wherein the polymer or copolymer of a monoolefinically unsaturated compound (d) is at least one member selected from the group consisting of polymers of acrylic acid, methacrylic acid, an acrylic ester and a methacrylic ester and copolymers comprising at least 50% by weight of these monomers.

9. A photosensitive resin film according to claim 1, wherein the polyfunctional, photo-polymerizable, unsaturated compound having at least two photo-polymerizable double bonds (e) is at least one member selected from the group consisting of diesters, triesters and tetraesters of acrylic and methacrylic acids, acrylates and methacrylates of alkyleneoxide adducts of Bisphenol A and compounds obtained by reacting a compound having at least two epoxy groups with acrylic or methacrylic acid.

10. A photosensitive resin film according to claim 1, 2, 3, 6, 7, 8 or 9, wherein said photo-crosslinking agent is at least one azide compound selected from the group consisting of 2,6-bis(4'-azidobenzal)cyclohexanone, bis(4-azidobenzal)-acetone, 4,4'-diazidostilbene and p-azidobenzalacetophenone, said photo-sensitizer is at least one carbonyl compound selected from the group consisting of p,p'-tetramethyldiaminobenzophenone, benzophenone, anthraquinone, 1,2-benzanthraquinone and violanthrone or at least one nitro compound selected from the group consisting of 5-nitroacenaphthene, α-nitronaphthalene and 2-nitrofluorene, and said photo-polymerization initiator is at least one benzoin compound selected from the group consisting of benzoin, benzoin methyl ether, benzoin isopropyl ether and benzoin dimethyl ketal, α,α-dimethoxy-α-phenylacetophenone, α,α-diethoxyacetophenone, or diphenyl disulfide.

11. A photosensitive resin film according to claim 1, 2, 3, 6, 7, 8 or 9, wherein said storage stabilizer is at least one alkylphenol compound selected from the group consisting of 2,2'-methylenebis(4-methyl-6-t-butylphenol), 2,2'-methylenebis(4-ethyl-6-t-butylphenol) and 2,6-di-t-butyl-p-cresol; at least one aromatic amine compound selected from the group consisting of phenyl-β-naphthylamine, diphenyl-p-phenylenediamine and phenylisopropylphenylenediamine; or at least one sulfur compound selected from the group consisting of dilauryl thiodipropionate, 4,4'-thiobis(6-t-butyl-m-cresol) and 2-(3,5-di-t-butyl-4-hydroxyanilino)-4,6-bis(n-octylthio)-1,3,5-triazine.

12. A photosensitive resin film according to claim 1, 2, 3, 6, 7, 8 or 9, wherein at least one of the composition comprising the components (a), (b), and (c) and the composition comprising (d), (e), (f) and (g) contains a dye, a pigment or both of them.

13. A photosensitive resin film according to claim 12, wherein said dye and pigment is selected from the group consisting of azo compounds, phthalocyanine compounds, anthraquinone compounds, perinone compounds, indigoid compounds, carbonium compounds and quinacridone compounds.

14. A photosensitive resin film according to claim 12, wherein the dye, the pigment or the mixture thereof is contained in a proportion of 0.01 to 3.0 parts by weight per 100 parts by weight of the cyclized product of butadiene polymer (a) or the polymer or copolymer of a monoolefinically unsaturated compound (d).

* * * * *